(12) United States Patent
Packard

(10) Patent No.: US 7,035,417 B1
(45) Date of Patent: Apr. 25, 2006

(54) SYSTEM FOR REDUCING NOISE IN THE REPRODUCTION OF RECORDED SOUND SIGNALS

(76) Inventor: Thomas N. Packard, 4811 McDonald Rd., Syracuse, NY (US) 13215

(*) Notice: Subject to any disclaimer, the term of this patent is extended or adjusted under 35 U.S.C. 154(b) by 0 days.

(21) Appl. No.: 09/286,575

(22) Filed: Apr. 5, 1999

(51) Int. Cl.
  *H04B 15/00* (2006.01)
(52) U.S. Cl. .................. 381/94.1; 381/94.5; 381/94.7; 381/94.8
(58) Field of Classification Search ............... 455/501, 455/224, 750; 381/94.1–94.9, 318; 379/329.01
See application file for complete search history.

(56) References Cited

U.S. PATENT DOCUMENTS

| | | | | |
|---|---|---|---|---|
| 4,095,191 A | * | 6/1978 | Shibuya ..................... | 331/4 |
| 4,155,041 A | * | 5/1979 | Burns et al. ................ | 455/501 |
| 4,322,641 A | * | 3/1982 | Packard ..................... | 327/311 |
| 5,303,415 A | * | 4/1994 | Takayama et al. .......... | 455/296 |
| 6,859,540 B1 | * | 2/2005 | Takenaka ................... | 381/94.3 |

OTHER PUBLICATIONS

M.M. Driscoll IEEE Paper 0-7803-3309-8/96 1996.*

* cited by examiner

*Primary Examiner*—Vivian Chin
*Assistant Examiner*—Andrew C. Flanders

(57) ABSTRACT

A noise reduction system is connected to at least two input channels for receiving input signals that have substantially identical program content but differing instantaneous noise transients. The system selects a filtered input signal that has the lowest instantaneous noise transient level. In another aspect, the noise reduction system removes instantaneous transient noise from an input signal by way of a blanker. The blanker includes a switch that opens whenever a band-pass filtered input signal is greater than the average level of the signal by a predetermined proportional amount. The input signal also includes continuous noise that is removed by a continuous noise suppressor. The continuous noise is removed by a low pass filter whose corner frequency is responsive to a differentiated input signal divided by the program component signal, or vice versa. In another aspect, the noise reduction system includes at least two of a switcher, blanker or continuous noise suppressor in connected in series to remove both instantaneous noise transients and continuous noise from an input signal.

39 Claims, 5 Drawing Sheets

SYSTEM FOR REDUCING NOISE IN THE REPRODUCTION OF RECORDED SOUND SIGNALS

BACKGROUND OF THE INVENTION

The present invention relates to the processing of electrical signals in connection with the recording and reproduction of sound, and in particular to the reproduction and the rerecording and playback of previously recorded sound signals.

The applicant is co-patentee of U.S. Pat. Nos. 4,155,041; 4,151,471 and 4,259,742 and is sole patentee of U.S. Pat. No. 4,322,641. These patents, which are incorporated herein by reference, are all concerned with the reduction of extraneous noises in the reproduction of analog sound recordings. These patents disclose three distinctly different and complementary systems for eliminating or reducing noises in the playback of old cylinder and disc records. The first of these systems eliminates noises in the reproduction of monophonic disc or cylinder records by virtue of a switching process that selects reproduction from the momentarily quieter groove wall or from an equal mixture of the two, requiring that the recording be reproduced with two-track, stereophonic equipment. The second of these systems eliminates or greatly reduces the amplitude of noise transients that remain after the switching process. The third system reduces the high frequency "hiss" that is not susceptible to reduction by the first and second systems. The second and third systems are applicable to both monophonic and stereophonic recordings.

The present invention provides new and improved means by which each of these three systems, individually and in combination, provides superior results in the reduction of noises and achieves major reductions in the artifacts which occasionally limited the versatility of the previous devices.

As used herein, the term "input signal" refers to the electrical signal, consisting of generally continuous and transient signals, bearing the audio information intended to be heard by the listener or receiver, plus noise signal. The term "noise signal" refers to the unwanted signals, both continuous and transient, which may be contained in the input signal. The terms "total signal", "signal plus noise" and "program plus noise" are employed, depending on the context, synonymously with "input signal." "Program content" or "music signal" refer to the input signal less noise signal.

SUMMARY OF THE INVENTION

The first of the three signal processors or systems, termed the Switcher, takes advantage of the circumstance that imperfections in a recording such as particulate matter in the record material, defects in manufacture, damage, dirt, wear, mildew, etc., which may introduce transient noises into the reproduction of the recording, are not usually identical on opposite sides of the record groove, whereas, in the case of monophonic phonograph recordings, the signals recorded on each side wall of the record groove normally are identical for all practical purposes. The prior invention, disclosed in aforementioned U.S. Pat. No. 4,259,742, reduces transient noises in the reproduction of a monophonic disc or cylinder recording by means of a three-way switching process between either of the groove's side walls or their average obtained by mixing equally the signal on the groove's two side walls. Signals were transmitted simultaneously over each of two channels with a normally open, fast acting switch in each channel. The switch in the channel with the least signal plus noise was closed to transmit only the signal from that channel to the output. When the difference between signal plus noise on both channels was below a predetermined threshold value, both switches remained open and the signals on both channels reached the output through respective resistors with a third, voltage dividing resistor. This system was not effective in suppressing noise components of opposite polarity and non-matching amplitude. The present invention addresses this problem by simultaneously closing both switches, thereby delivering the average of the total signal on both channels to be conducted to the output.

The second of these three processors detects noise transients and in response thereto institutes a "blanking" action that limits both positive and negative pulsations of a transient so that they do not exceed a threshold value established relative to the momentary peak value of the signal in the vicinity of the transient. However, in some cases, in program material with very steep transients, such as commonly found in recordings of guitar, harpsichord, pizzicato strings and an occasional strongly attacked vocal note, the Blanker sometimes produced audible artifacts. It also had some trouble in distinguishing drum transients from noise transients, and in suppressing low level noise transients in low signal level areas. The Blanker of the present invention remedies these problems through the use of two fast acting switches, one of which interrupts only high frequency components of the noise transient and the other interrupting low frequency components.

The third system, a "Continuous Noise Suppressor", reduces noise of a continuous nature, usually referred to as "hiss" or, roughly, as "white noise", by means of an electronic circuit wherein the upper limit of the band width of the signal is automatically and continually adjusted in accordance with the relationship of (1) the peak amplitude of the rate of change of the signal with respect to time (i.e. the second derivative of the signal) to (2) the instantaneous amplitude of the signal within a selected frequency band. The Continuous Noise Suppressor disclosed herein has a more effective treble attenuation characteristic with a lower minimum cutoff frequency and a more rapid response to the changing dynamics of a recording, thus further reducing to the acute listener audibility of the continual modications of the cutoff frequency.

DESCRIPTION OF THE PREFERRED EMBODIMENT

The three systems or processing stages for removing noises from sound signals emanating from such sources as sound recordings, radio broadcasts and the like, may be employed individually or in combination, as dictated by the requirements of the job at hand. The first disclosed system, the Switcher, two signals which are substantially identical in program content, but which may differ in total signal amplitude due to differing noise content, are received simultaneously on respective channels and appropriate electronic circuitry compares to two input (total) signals and transmits to the recording or reproducing apparatus either: 1. an equal mixture (average) of the two input signals, or 2 the input signal on one of the channels. When that input signal has an amplitude which is lower than the average of the amplitudes of the two input signals by more than a predetermined threshhold amount.

The Switcher

Figure 1:
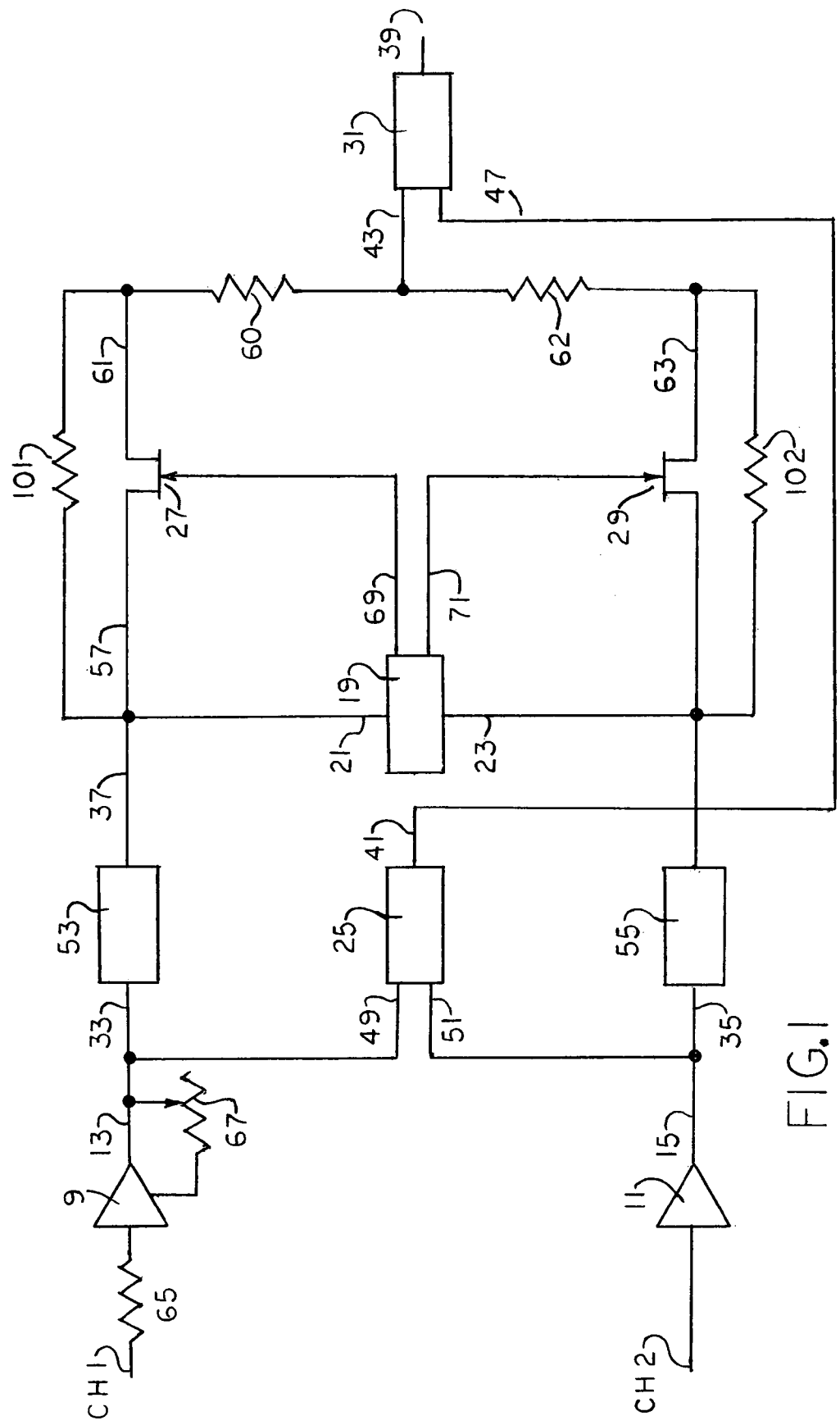
FIG. 1 is a schematic and block diagram representation of the switching system.

Referring now to FIG. 1, there is illustrated a system which includes two input channels designated as Channel 1 and Channel 2. For the purposes of this description Channel 1 and 2 are presumed to be the two channels of a stereophonic playback system, although these channels can be the output of any device that is transmitting two signals that are identical in their program component but differ in their noise content. These two channels are connected to the signal sources such that the instantaneous voltage of the program component in each is of the same polarity.

The signals on Channel 1 and Channel 2 are applied to amplifiers 9 and 11 respectively. Associated with amplifier 9 are the fixed resistor 65 and the adjustable resistor 67. These two resistors govern the amount of negative feedback applied to amplifier 9, the gain of the amplifier being adjustable in accordance with the setting of adjustable resistor 67. The values of the two resistors can be chosen so that, when adjustable resistor 67 is set at its center point, the gain of amplifier 9 equals that of amplifier 11, thus making it possible to adjust the gain of amplifier 9 over a considerable range of values both above and below the gain of amplifier 11, so that a considerable imbalance between the levels of the program component of the input signals (i.e. signal less noise) of Channels 1 and 2 can readily be compensated for. For the sale of simplicity, the signals being applied to Channels 1 and 2 will be assumed to be equal. However, it should be understood that signals of unequal magnitude can be accommodated by virtue of the adjustable gain of amplifier 9.

For optimum operation of the Switcher it is necessary to adjust the program component signal levels of the outputs of amplifiers 9 and 11 to equality with phase accuracy, which is achieved by providing amplifier 11 with a unity-gain, polarity-reversing switch (12) and then auditing the output of the Switcher with the switching action turned off. The gain of amplifier 9 is then adjusted with adjustable resistor (potentiometer) 67 for maximum cancellation of the program component i.e. minimum "music" signal via listening. This also allows one to audition noise components independently of the program component. The polarity reversing switch is to be switched back to the non-reversing position after the potentiometer adjusting procedure is concluded. The signals applied to Channels 1 and 2 would be of the same polarity when they are the output channels of a standard, two-channel, stereophonic record-playback system playing a lateral-cut monophonic recording. When reproducing a vertical-cut disc or cylinder with the same stereophonic record-playing system, the signals applied to Channel 1 would be of opposite polarity to those applied to Channel 2 and, in that case, the inverse of the above procedure would be employed.

The output terminal 13 of amplifier 9 is connected to the input 33 of low frequency attenuator 53 and also to input 49 of low frequency restorer 25. Similarly, the output 15 of amplifier 11 is connected to the input terminal 35 of low frequency attenuator 55 and to input terminal 51 of low frequency restorer 25. The output terminal 37 of low frequency attenuator 53 is connected to terminal 57 of a normally open, fast-acting switch 27 and also to input 21 of the control unit 19. The output terminal 39 of low frequency attenuator 55, identical to attenuator 53, is connected to terminal 59 of normally open, fast-acting switch 29 and also to input 23 of control unit 19. The output 61 of switch 27 is connected through resistor 60 to the input 43 of summer 31; output 63 of switch 29 is connected through resistor 62, to input 43 of summer 31. The output 41 of low frequency restorer 25 is connected to input 47 of summer 31. The output 39 of summer 31, which is the output of the Switcher, should be identical to the signal that is presented in Channel 1 and/or Channel 2 less the detected audible noise transients which the switching process has eliminated.

Resistor 101 is in parallel with switch 27 and resistor 102 is in parallel with switch 29. These two resistors are of equal value and, when switches 27 and 29 are both open, provide equal conductive paths to summer 31 from the outputs of both low frequency attentuators 53 and 55. These attenuators serve to eliminate from the switching process low frequency disturbances such as rumble, hum and thumps which either exist on a recording or may be introduced in the playback process. These attenuators also serve to protect the control unit from misoperations which could be caused if these disturbances were not filtered out. The integrity of phase relations within the program content of the signal is preserved by designing the circuit of the low frequency restorer 25 to be an inverse complement of the low frequency attenuator circuits 53 and 55 such that the sum of the signals at 37 and 41 is identical in its frequency and phase relationships with that at output 13 of amplifier 9.

Figure 2:
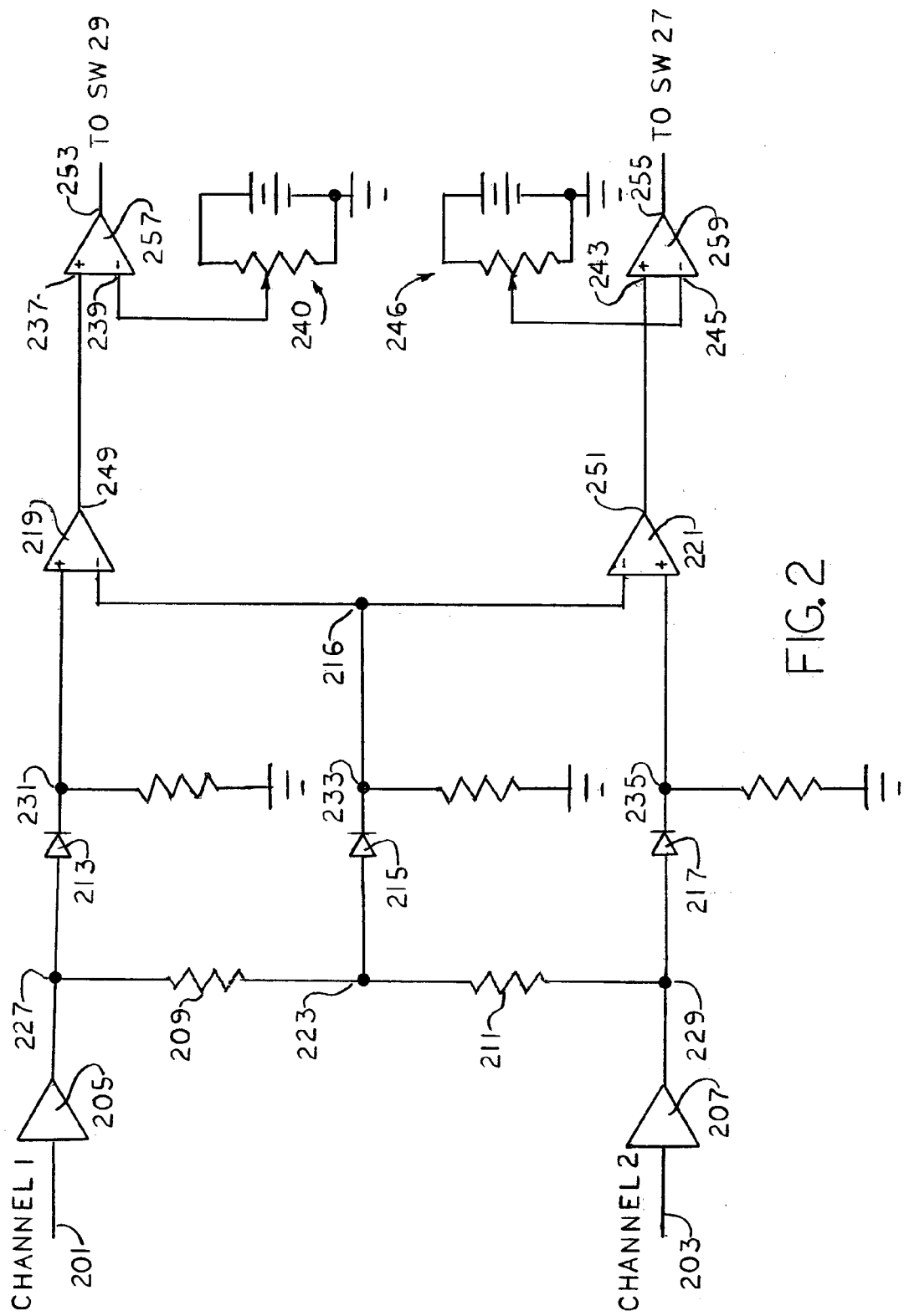
FIG. 2 is a schematic diagram of the control circuit shown in block form in FIG. 1.

A first embodiment of control circuit 19 is shown in FIG. 2, wherein inputs 201 and 203 correspond to control circuit inputs 21 and 23, respectively, of FIG. 1. The inputs 201 and 203 are connected, respectively, to buffer amplifiers 205 and 207 that are identical in amplification. The outputs of buffer amplifiers 205 and 207 are connected to a bridging circuit consisting of resistors 209 and 211 that are equal in value and are joined at junction 223. The inputs of full wave rectifiers 213 and 217 are connected to the outputs of buffer amplifiers 205 and 207, respectively, and the input of full wave rectifier 215 is connected to junction 223. The instantaneous signal voltage at junction 223 will be equal to the average of the instantaneous signal voltage at junctions 227 and 229. Thus the output of full wave rectifier 213 will be a fluctuating positive voltage that will represent the absolute value of the instantaneous signal of Channel 1 after processing through the low frequency attenuator 53 of FIG. 1. Similarly, the output of full wave rectifier 217 will represent the absolute value of the instantaneous signal of Channel 2 after passing through the low frequency attenuator 55 of FIG. 1. As resistors 209 and 211 are identical in value, full wave rectifier 215, which receives its input from junction 223 of these two resistors, the output of full wave rectifier 215 will represent at any given moment the absolute value of the average of the instantaneous signal of Channels 1 and 2.

The output 233 of rectifier 215 is connected to the negative input terminal of both subtraction circuits 219 and 221 through junction 216. The positive input terminal of subtraction circuit 219 is connected to the output 231 of rectifier 213, which derives its signal from Channel 1, and the positive input terminal of subtraction circuit 221 is connected to output 235 of rectifier 217, which derives its signal from Channel 2. The voltage differential between the input terminals of subtraction circuit 219 is expressed at output 249 and transmitted to the positive input terminal 237 of comparator 257. Similarly, the output 251 of subtraction circuit 221 is connected to the positive input terminal 243 of comparator 259. Voltage biasing devices 240 and 246 are connected to negative terminals 239 and 245 of comparators 257 and 259, respectively. The subtraction circuits 219 and 221 subtract the instantaneous voltage of their negative input terminal from the instantaneous value of their positive terminal, the results being delivered to terminals 249 and 251, respectively, which are connected to the positive input terminals 237 and 243 of comparators 257 and 259, respectively. The threshold point of operation of the comparators is chosen by means of a user-operated dual potentiometer that sets the same bias point at the negative input terminal of each, thus assuring an exact reciprocity of action in the noise reduction activities of each channel. The voltage at the circuit junctions (227, 229, 223, 231, 233, 235, 249, 251, 253 & 255) determine when the fast acting switches 27 and 29 (FIG. 1) are opened or closed.

Operation of the control circuit of FIG. 2 under each of these operating conditions will now be explained.

In Case 1 consider that signals substantially identical both in polarity and in amplitude are received simultaneously at Channel 1 and Channel 2. This case represents a momentary condition in which there is no appreciable noise component in either channel. Voltages at 227 and 229 are identical, or closely so, and the voltage at junction 223 is at the average of those at 227 an 229. The full wave, positive, pulsating waveforms at junctions 231 and 235, i.e., the outputs of full wave rectifiers 213 and 215, respectively, nearly match in value and polarity such that the difference voltage at the output 249 of the subtraction circuit 219 is negligible in normal operation of the device and at a value less than the user-adjusted positive DC voltage connected to the inverting input 239 of comparator 257. Thus, the output 253 of comparator 257 is insufficient to actuate the normally open fast acting switch 29 and terminals 59 and 63 (FIG. 1) are not connected. Likewise, the positive, pulsating wave forms at 233 and 235 nearly match with the result that the difference voltage at 251 is negligible and at a value less than the pre-established positive voltage connected to the inverting input of comparator 259. The output 255 of comparator 259 is too low to actuate the normally open fact acting switch 27. Thus, terminals 57 and 61 are not connected. Consequently, equal value resistors 101 and 102 conduct signals from low frequency attenuators 53 and 55 to summer 31, In this manner, when there is negligible noise and, thus, the instantaneous signals of Channel 1 and Channel 2 are identical, or almost so, the output of summer 31 provides a monaural mix of the signals received at Channels 1 and 2.

In Case 2 consider that an instantaneous voltage is received at the input of Channel 1 and that a lesser input voltage of the same polarity is received at the input of Channel 2, simultaneously applying a voltage, V, at 227 and a voltage, kV, at 229, where k is a positive number between 0 and 1. The voltage resulting at 223 will be the average of the two voltages, namely (k+1)V/2. The voltages at 227, 223 and 229, after undergoing full wave rectification, will be expressed as positive voltages at 231, 233 and 235 that will have values, respectively, of $V^1$, (k+1) $V^1/2$ and $V^1$. The voltage at 249 is equal to the voltage at 231 minus the voltage at 233 or (1−k) $V^1/2$. Since k has a value between 0 and 1, the voltage at 249 is positive. Through the conditions posited for Case 2, the magnitude of the positive voltage at 249 exceeds the magnitude of the positive, pre-established, user-adjustable voltage at the inverting input of comparator 257. The output at 253 is high, resulting in a connection between terminals 59 and 63 of the fast-acting switch 29, as the resistance of closed fast-acting switch 29 is much smaller than that of resistor 102. The voltage at 251 is the voltage at 235 minus the voltage at 233, or (k−1) $V^1/2$. Since k is between 0 and 1, the voltage at 251 is negative. This negative voltage at 251 and the positive, pre-established voltage at the inverting input 245 of comparator 259 result in output 255 being low. Consequently, fast acting switch 27 remains in the open position. Summer 31 accepts signals from Channel 1 through resistor 101 and from Channel 2 through fast acting switch 29. Since the resistance of closed switch 29 is much smaller than the resistance of resistor 101, and in consideration of the voltage divider action between two resistances, the signal from Channel 1 is not conducted. In this manner, when there is noise in Channel 1 and a lesser amplitude of the same polarity in Channel 2, the output of summer 31 delivers only the signal received in Channel 2, Through a similar consideration, should the greater instantaneous voltage of the same polarity be received at Channel 2, the output of summer 31 will deliver only the signal received at Channel 1.

In Case 3, consider than an instantaneous voltage is at Channel 1 and that an instantaneous voltage of opposite polarity and lesser amplitude is received at Channel 2, Channel 1 providing a voltage, V, at 227 and Channel 2 providing a voltage, −kV, at 229, where k is a positive number between 0 and 1. The voltage at 223 will be (1−kV)/2, the average of the voltages at 227 and 229. The voltages at 227, 223 and 229 are then full-wave rectified by rectifiers 213, 215 and 217, respectively. Note, in particular, that although the voltage at 229 which enters full wave rectifier 217 is negative, namely −kV, the voltage at 235 will be the positive quantity represented by $kV^1$. The voltage at 249 will equal the voltage at 231 minus the voltage at 233, or (1+k)$V^1/2$. Through the conditions posited for Case 3, and the magnitude of the positive voltage at 249 exceeds the magnitude of the positive, pre-established voltage at the inverting input 239 of user-adjusted comparator 257 in normal operation of the device. Consequently, fast acting switch 29 will close, connecting terminals 59 and 63. The instantaneous signal at 251 is a linear function of the voltage at 235 minus the voltage at 233, i.e. (3k−1)V/2. If k has a positive value between 0 and ⅓, the polarity at 251 is negative, the output of comparator 259 is low and fast acting switch 27 will remain open, If k is a positive number between ⅓ and 1 and, through the conditions posited as Case 3, the magnitude of (3k−1) $V^1/2$ exceeds the positive, pre-established, user-adjusted voltage at the inverting input 245 of comparator 259, then the output of comparator 259 assumes a value sufficient to close fast acting switch 27. In this manner, when the magnitude of the instantaneous voltage of Channel 2 is between ⅓ of and equality with the instantaneous voltage of Channel 1, and of opposite polarity, the circuit chooses an equal mixture (i.e. the average) of Channels 1 and 2. Through the foregoing process of analysis, it can be demonstrated that if the magnitude of the instantaneous voltage of Channel 1 is between ⅓ of and equality with the instantaneous voltage of Channel 2 and of opposite polarity the output of the circuit is also an equal mixture (i.e. the average) of Channels 1 and 2.

Figure 3:
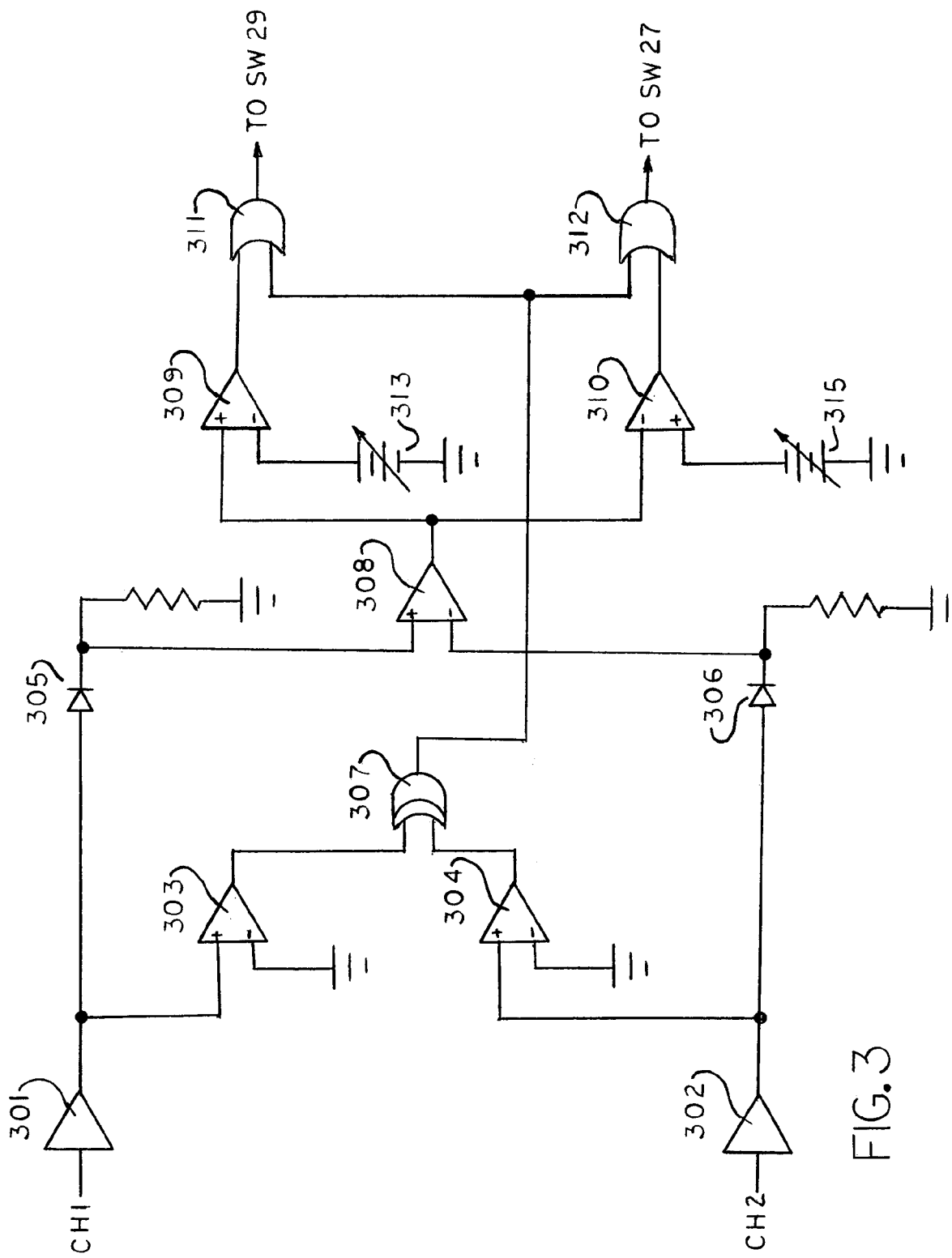
FIG. 3 is a schematic diagram of an alternate embodiment of the control circuit.

FIG. 3 illustrates another control circuit that can be used in place of the preferred circuit just described. Input buffers 301 and 302 of the FIG. 3 embodiment serve the same functions and circuit positions as do buffers 205 and 207, respectively, of FIG. 2, and the outputs of OR gates 311 and 312 operate switches 27 and 29, respectively, of FIG. 1 in the same manner as comparators 257 and 259 of the control circuit of FIG. 2. Full wave rectifiers 305 and 306 track the absolute magnitude of the instantaneous peak value of the input signal (i.e. program plus noise) of input Channels 1 and 2 respectively. The output of rectifier 305 is connected to the positive input terminal of subtraction circuit 308 and the output of rectifier 306 is connected to the negative input terminal of subtraction circuit 308. The output of subtraction circuit 308 connects to both the positive input terminal of comparator 309 and the negative input terminal of comparator 310. The negative input terminal of comparator 309 receives a positive D.C. bias from a user-adjustable voltage source 313 and the positive input terminal receives a negative D.C. bias from a user-adjustable voltage source 315. The user-adjustment is accomplished by means of two concentrically mounted linear taper potentiometers identical in value, so as to provide bias voltages at comparators 309 and 310 equal in value though opposite in polarity. The output of comparator 309 connects to one input of OR gate 311 and the output of comparator 310 connects to an input of OR gate 312.

The output of subtraction circuit 308 is positive when the instantaneous absolute voltage of Channel 1, as transmitted by buffer 301 and full wave rectifier 305, exceeds in magnitude the instantaneous absolute voltage of Channel 2, as transmitted by input buffer 302 and full wave rectifier 306. If the positive output from the subtraction circuit 308 exceeds the pre-established positive voltage at the inverting input of comparator 309, comparator 309's output is a positive voltage. As a result, the output of OR gate 311 is assured of being a positive voltage irrespective of the polarity of its other input, thus causing fast-acting switch 29 to close. Thus this signal from Channel 2 is received by summer 31 while signal from Channel 1 is excluded. Conversely, the output of subtraction circuit 308 is negative if the instantaneous absolute value of the input signal (i.e. program plus noise) voltage of Channel 2 exceeds in magnitude the instantaneous absolute value of the input signal voltage of Channel 1. If the negative output voltage from subtraction circuit 308 exceeds the pre-established negative voltage at the non-inverting input of comparator 310, the output of comparator 310 assumes a positive value. The output of OR gate 312 goes high irrespective of the voltage state of its other input and fast acting switch 27 is closed. This results in signal from Channel 1 being received by summer 31 (FIG. 1) at the exclusion of signal from Channel 2. In this manner, when there is noise in Channel 2 and a lesser noise in Channel 1, the output of summer 31 is only the signal from Channel 1. The positive inputs of comparators 303 and 304 are connected to the outputs of buffers 301 and 302, respectively. The negative inputs of comparators 303 and 304 are connected to ground. The output of comparator 303 goes positive when the voltage from buffer 301 is positive with respect to ground. The output of comparator 304 goes positive when the voltage from buffer 302 is positive with respect to ground. The outputs of comparators 303 and 304 are connected to the two inputs of EXCLUSIVE OR gate 307. The output of EXCLUSIVE OR gate 307 goes positive if the output of comparator 303 alone or 304 alone is positive. Expressed differently, EXCLUSIVE OR gate 307 is negative if the signals on Channels 1 and 2 are of the same polarity, and the output of EXCLUSIVE OR gate 307 is positive if the signals on Channels 1 and 2 are of opposite polarity. The output of EXCLUSIVE OR gate 307 is connected to the other inputs of OR gates 311 and 312. If the output of EXCLUSIVE OR gate 307 is positive, the outputs of OR gates 311 and 312 are positive irrespective of the voltage applied at their other inputs. Fast acting switches 27 and 29 both close, imparting a monaural mix of signals from Channels 1 and 2 to summer 31. As has been described, the alternate embodiment represented in FIG. 3 produces the same actions as the embodiment in FIG. 2, except in the case of input signals in Channels 1 and 2 having opposite polarity. The FIG. 2 embodiment enables a monaural mix of the input signals when the input signals are of opposite polarity and have amplitudes within 30% of each other. Whereas the embodiment of FIG. 3 enables a monaural mix of the two signals if the signals are of opposite polarity at all relative levels to each other.

In some situations where it is not necessary or desirable to suppress "ticks" or other transient noise components, there may exist dropout, fading or other sudden changes in the level of the input signal which it may be desired to alleviate. The latter object can be achieved with the circuit in FIG. 2, modified by connecting the input of rectifier 213 to junction 229 (the output of amplifier 207) thereby deriving signal from Channel 2, and connecting the input of rectifier 217 to junction 227 (the output of amplifier 205) thereby deriving signal from Channel 1. Outputs from subtraction circuits 219 and 221 and comparators 257 and 259 are now reversed and the operations of fast-acting switches 27 and 29 are also reversed. Thus, the fast-acting switches 27 and 29 that normally function to assure the transmission of signal from the channel that has the lesser total instantaneous signal level with respect to the average signal of the two channels will now function to secure transmission of the signal from the channel that has the greater instantaneous total input signal level. By replacing the permanent connections shown in FIG. 2 between the input of rectifier 213 and junction 227 and the permanent connection between the input of rectifier 217 and junction 229 with a reversing switch, one can achieve, with one piece of equipment, the two modes of operation. Such a switch is also useful in demonstrating and testing the operation of the Switcher by comparing the noise audible in the two different positions of the switch This feature is disclosed in earlier referenced U.S. Pat. No. 4,259,742.

The Blanker

Figure 4:
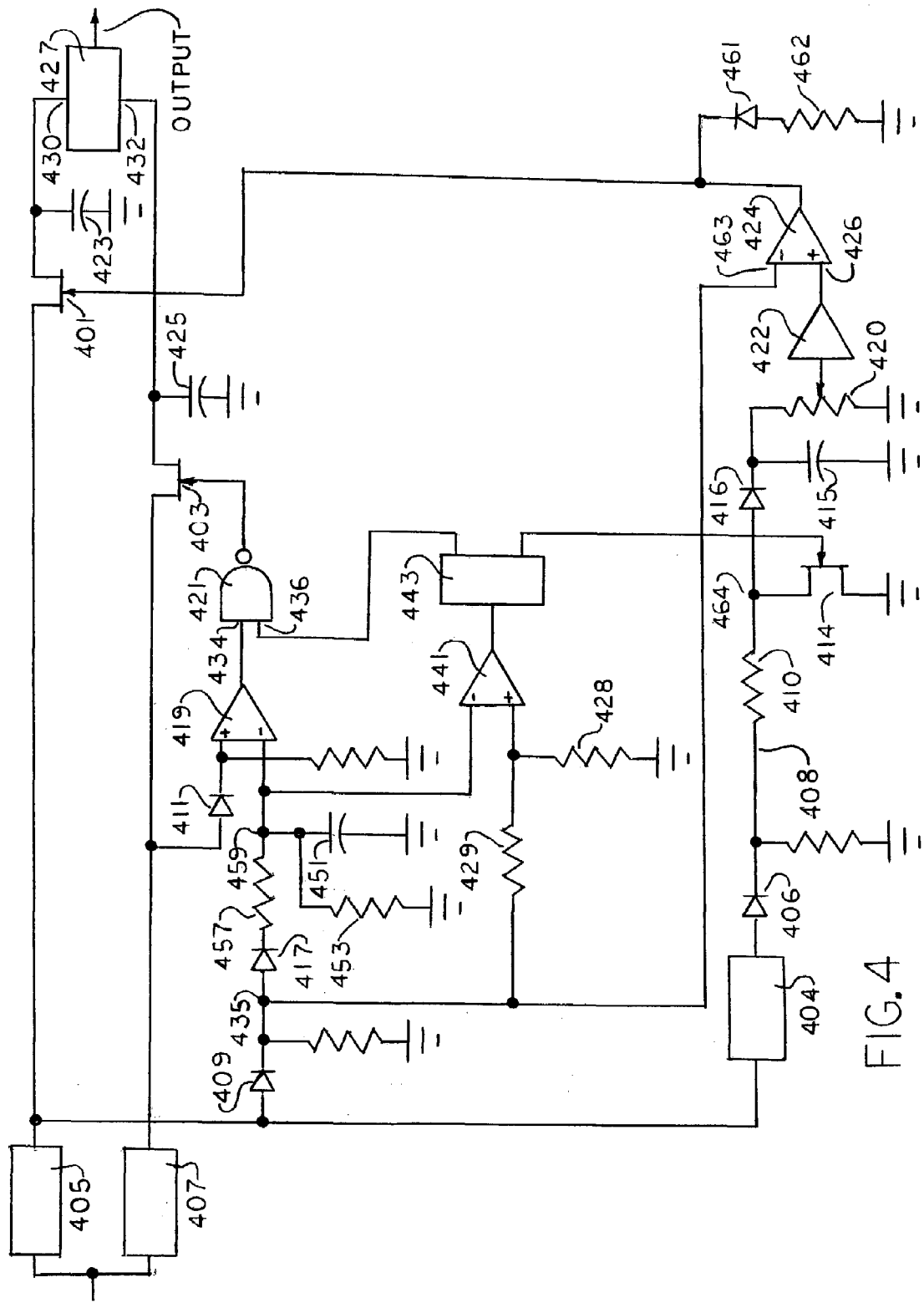
FIGS. 4 and 5 are schematic diagrams of the Blanker and Continuous Noise Suppressor, respectively.

After processing by the Switcher the signal next enters the Blanker, a preferred embodiment of which is shown in FIG. 4.

This processor limits the amplitude of noise transients by dividing the signal channel into a high frequency path and low frequency path wherein high frequency noise transients are limited in accordance with the peak amplitude of the program component in the vicinity of each individual noise transient and noise transients in the low frequency path are discriminated from program transients by virtue of the noise transients' high frequency content and limited in accordance with the peak amplitude of the low frequency path's program content in its vicinity. The two paths are then re-united such that the signal exiting the Blanker is identical with the input signal save for the suppression of the noise transients.

The incoming signal is applied simultaneously to the input of high pass filter 405 and to low pass filter 407, thus dividing the signal into two branches, in one of which the low frequency transient noises are to be eliminated or suppressed and in the other of which the high frequency transient noises are to be eliminated or suppressed. High pass filter 405 has a low frequency attenuation characteristic of 12 db per octave with its turnover frequency at 800 Hz and low pass filter 407 has a characteristic inversely complementary to that of 405 starting, also, at 800 Hz, such that signal paths 430 and 432, when re-combined in mixer 427, will become a signal identical to the input signal with the exception that noise transients have been eliminated or suppressed.

The elimination of transient noises is effected by switch 401 for the high frequency signal path and by switch 403 for the low frequency signal path. Both switch 401 and switch 403 are fast-acting, normally closed switches. Each switch opens whenever its control circuit detects a noise transient that is to be eliminated. The charge on either capacitor 423, connected to the output terminal 402 of switch 401 to ground, or on capacitor 425, connected to the output terminal 404 of switch 403 to ground, serves to provide a signal continuity in its path during the brief time that the switch is open.

Switch 401 is triggered to open by comparator 424 when the voltage at the negative input terminal 463 of comparator 424, which is derived from the total signal (program plus noise) at the output of high pass filter 405, exceeds the voltage at positive input terminal 426 of comparator 424, which voltage is indicative of the "signal without noise" level from high pass filter 405, as follows: The output of high pass filter 405, the characteristics of which were described above, has a connection to the low pass filter. Filter 404 has an 18 db per octave high frequency attenuation characteristic with its turnover frequency at 3 kHz. Since the signal entering filter 404 had previously undergone an attenuation of low frequencies of 12 db per octave starting at 800 Hz, the signal emerging from filter 404 has had its components below 800 Hz and above 3 kHz drastically diminished in magnitude. The frequency range below 3 kHz is the range in which the program content of the input signal dominates over high frequency surface noise of recordings such that the output of filter 404 can successfully be taken as representative of the level of signal without high frequency noise. In addition it is not desirable that transients or program material below 800 Hz influence the operation of switch 401. The output of filter 404 is connected to the input of full wave rectifier 406 the output of which is connected to junction 408. Thus, junction 408 registers the momentary absolute value of signal from filter 404. Resistor 410 is connected between the output of full wave rectifier 406 and the input of rectifier 416. Rectifier 416 in conjunction with capacitor 415 and potentiometer 420, both connected to ground, serves as a peak detector. Should the voltage at rectifier 416 diminish, the voltage on capacitor 415 discharges through the resistance of potentiometer 420, the discharging time constant chosen to be approximately 100 milliseconds. The slider of potentiometer 420 is connected to the input of D.C. amplifier 422, the output of which is connected to the positive input terminal 426 of comparator 424. Thus, the relatively slowly discharging voltage at the output of peak detector (rectifier) 416 is providing, by means of user-adjustable potentiometer 420 and D.C. buffer amplifier 422, threshold voltage at positive terminal 426 of comparator 424, this threshold voltage being representative of the ever-changing absolute value of the program content (signal-without-noise) of the signal. The output of high pass filter 405, expressing high-frequency components of the input signal, is connected to full wave rectifier 409, which has no capacitor associated with it to slow its charging or discharging time, thus constituting a tick detector. The output of rectifier 409 is connected directly to negative terminal 463 of comparator 424. When a tick whose frequency content exceeds 3 kHz occurs and the positive voltage at input 463 exceeds the positive voltage of input 426 of comparator 424 thereby, the output of comparator 424 becomes sufficiently negative to open switch 401. Thus, the ticks exceeding approximately 3 kHz are not transmitted from high pass filter 405 to mixer 427 when the tick amplitude exceeds the threshold voltage at terminal 426, which is governed by the sum of the voltage output of peak detector 416 and, furthermore, by the setting of user-adjustable potentiometer 420. Low frequency noise transients are typically caused by scratches, needle drops and cracks in the record. Playback of these yields loud noise transients, rich in both low and high frequencies. Music instruments that produce strong low frequency transients, most notably drums, are far less rich in high frequencies transients than are the scratches, needle drops and cracks. Thus, we are provided with a useful criterion for distinguishing between loud, low frequency noise transients and low frequency music transients.

Low frequency noise transients are suppressed by opening fast acting switch 403. Switch 403 is controlled by NAND gate 421 and opens if the output of NAND gate 421 is sufficiently negative, which requires that positive voltages be applied simultaneously to terminals 434 and 436 of NAND gate 421. Input terminal 434 is connected to the output of comparator 419 which is a positive voltage when the positive instantaneous voltage at the output of full wave rectifier 411 connected to the positive input terminal of comparator 419 exceeds the positive voltage at the negative input terminal of comparator 419. The positive input terminal of comparator 419 is connected to the output of full wave rectifier 411, the input of which is connected to the output of low pass filter 407. The negative input of comparator 419 is connected to the output of a peak detector consisting of rectifier 417 and resistor 457 feeding capacitor 451 and resistor 453, the latter both connected to ground. The purpose of resistor 457 is to provide a time delay of approximately five milliseconds in the charging of capacitor 451 so that the voltage at the output of peak detector, junction 459 is not affected by short noise transients. The input of full wave rectifier 411 is connected to the output of low pass filter 407 and the input of rectifier 417 is connected to the output 435 of full wave rectifier 409. The input of full wave rectifier 409 is connected to the output of high pass filter 405. The values of capacitor 451 and resistor 453 are chosen to provide a discharging time constant of approximately 20 milliseconds. The discharging time constant provides some short term stability to the voltage serving as bias voltage to the negative input terminals of comparators 419 and 441. The positive input terminal of comparator 441 is connected to the junction of resistors 428 and 429. The other end of resistor 428 is connected to ground and the other end of resistor 429 connects to junction 435 the output terminal of full wave rectifier 409 Resistors 428 and 429 attenuate the voltage derived from junction 435 in order that switch 403 opens only in response to large amplitude, high frequency noise transients, i.e., those that exceed the peak program content by a factor of three or more, as lesser noise transients do not typically have enough low frequency content to warrant a blanking procedure in the low frequency signal path. If the transient at the positive input terminal of comparator 441 received from rectifier 409 and high pass filter 405 exceeds the peak signal at 459, its negative input terminal, the output of comparator 441 becomes sufficient to trigger monostable multivibrator 443. The output voltage of multivibrator 443 closes fast acting switch 414 for approximately 1.5 milliseconds. When fast acting switch 414 is closed, the signal at the ouput of resistor 410 is shorted to ground.

Filter 404 is intended to feed "music" signal through rectifier 406 through peak detector 416, buffer amplifier 422 and to the input 426 of comparator 424. The 3 kHz corner frequency selected for filter 404 is suitable for eliminating high frequency ticks but may pass some low frequency tick transients. Due to the delay in filter 404, control switch 414 will be triggered to close before the low frequency transient appears at the output of filter 404. During the 1.5 milliseconds that switch 414 is closed, the 100 millisecond time constant of the circuit at the output of peak detector 416 serves to maintain the voltage that it had just before switch 414 closed, so that the circuitry that operates switch 401 will be undisturbed by low frequency noise transients having frequency components below 3 kHz. The output of monostable multivibrator 443 also connects to the second input 436 of NAND gate 421. When there is a tick having sufficient amplitudes determined both above and below 3 kHz, there is sufficient positive voltage at inputs 434 and 436 to make the output at NAND gate 421 sufficiently negative to open switch 403. In this manner the low frequency ticks at low pass filter 407 are not transmitted to mixer 427. If desired, visual indicators of operability of either of both of switches 401 and 403 may be provided. For example, light emitting diode 461 is connected to the output of comparator 424 and, through series resistor 462, to ground without compromising the output voltage of the comparator driver. When the output of the comparator goes low, light emitting diode 461 illuminates to indicate opening of switch 401.

The Continuous Noise Suppressor

Figure 5:
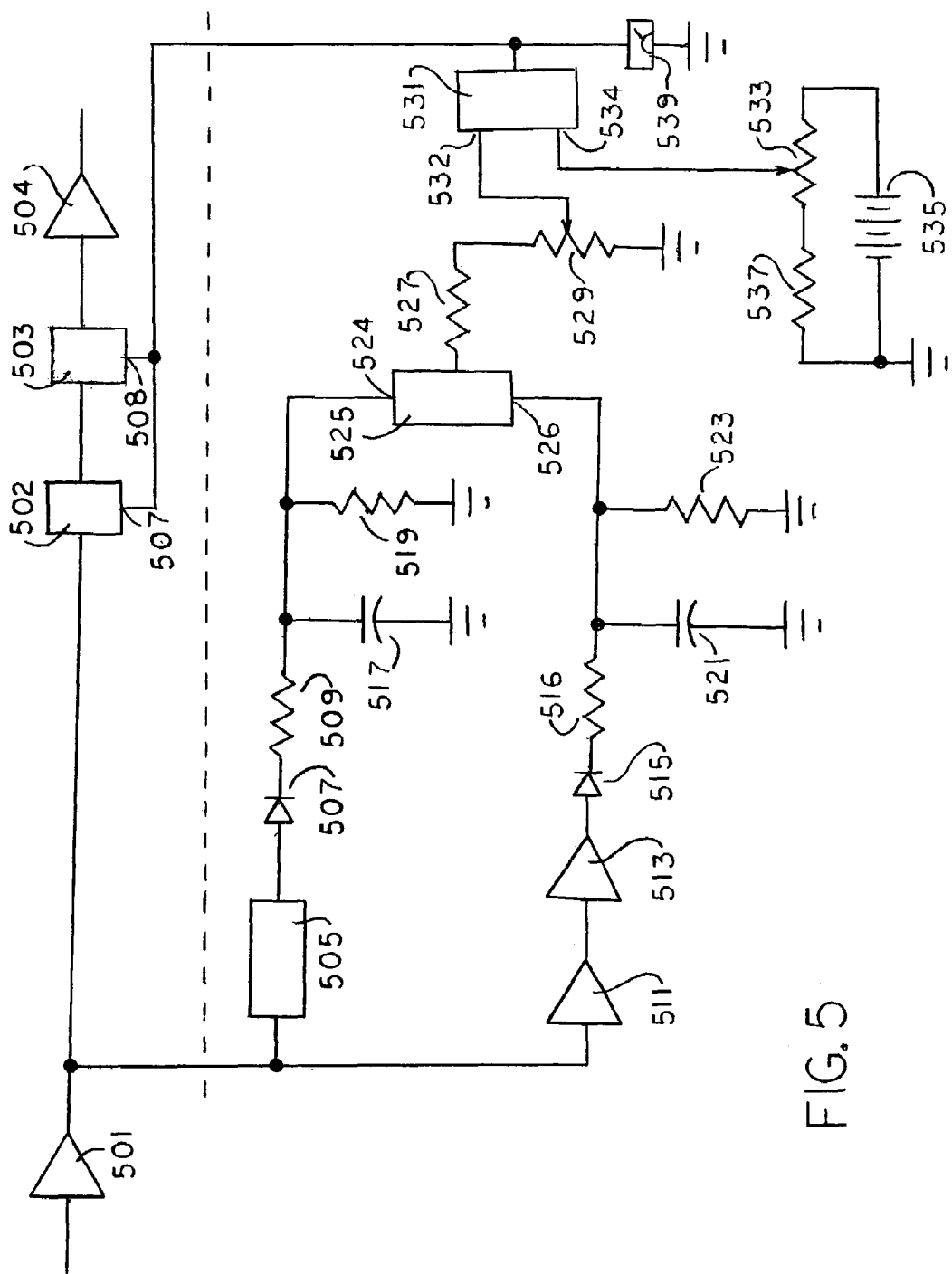

The input of the system shown in FIG. 5 is connected to buffer amplifier 501. The output of the buffer amplifier connects to the input of voltage controlled filter 502, the output of which connects to the input of voltage controlled filter 503, the output of which connects to the input of amplifier 504, which is the output amplifier of the Continuous Noise Suppressor system. Each of the voltage controlled filters has a high frequency attenuation characteristic of 6 db per octave with the turnover frequency being directly proportional to a control voltage applied simultaneously at terminals 507 and 508, respectively, of the filters 502 and 503 by the control unit, the components and configuration of which are diagrammed below the dashed lines in FIG. 5. Voltage controlled filter 503 is designed so that its cutoff frequency is approximately an octave above the cutoff frequency of filter 502 for all values of the control voltage applied to each simultaneously, thus producing at the output of filter 503 a response curve that will be at an attenuation rate of 6 db per octave for the first octave of attenuation and at a rate of 12 db per octave starting at the second octave of attenuation. This attenuation curve was determined to be more subtle and effective in listening tests than is the previously employed curve of 8 db per octave with no inflexion point that was employed in the unit described in U.S. Pat. No. 4,322,641.

The comparison and control means, which are diagrammed below the dashed lines in FIG. 5, has two branches. The upper branch, which is representative of the "music" content of the signal, receives its input from the output of input buffer amplifier 501. The signal in this branch is processed through band pass filter 505, with corner frequencies of approximately 1 kHz and 3 kHz. The output of the band pass filter 505 connects to the input of a peak detector which consists of full wave rectifier 507, resistor 509 and capacitor 517. Resistor 509 connects the output of rectifier 507 to the input 524 of voltage divider integrated circuit 525 and also to capacitor 517 and resistor 519, the other side of each of the latter two being grounded. The full wave rectified voltage appearing at terminal 524 is taken as representative of the program component of the total signal.

In the lower branch of the control circuit the signal passes successively through two differentiators 511 and 513 in series. The output of differentiator 513 is connected to a peak detector consisting of full wave rectifier 515, resistor 516, and capacitor 521. Resistor 516 connects the output of rectifier 515 to input 526 of voltage divider integrated circuit 525 and also to capacitor 521 and resistor 523, the other side of each of the latter two being grounded. The signal is representative of the rate of change of the rate of change (i.e. of the acceleration component) of the input signal. Values of capacitor 517 and resistor 519 are chosen to provide a time constant of approximately five milliseconds, thus producing some short term stability of the signal at 524 and also playing a role in desensitizing the unit from being disturbed by noise transients, as the value of resistor 509 is chosen to provide, in combination with capacitor 517, a time constant of approximately 2 milliseconds. Similarly, in the lower branch, capacitor 521 and resistor 523 have a time constant of about 2.5 milliseconds and a capacitor 521 and resistor 516 are chosen to produce a time constant of approximately 1 millisecond. Noise transient de-sensitization is needed when this processor is employed as a stand-alone device. However, noise transient de-sensitization is accomplished by the addition of only two resistors (509 and 516) and is also beneficial should an unexpected noise transient succeed, at least in part, in getting through the two previous processors. The output voltage divider integrated circuit 525 provides a voltage that is proportional to the ratio of the voltage at terminal 524 to that at terminal 526. Resistor 527 is connected between the output of integrated circuit 525 and the high end of potentiometer 529. The slider of potentiometer 529 goes to input 532 of mixer 531 and the other end of potentiometer 529 goes to ground. Potentiometer 529 is user-adjustable and is labeled "Ceiling". The other input terminal 534 of mixer 531 is connected to a D.C. bias arrangement symbolized by a D.C. voltage source 535 with a potentiometer 533 in series with a resistor 537 connected across it. This potentiometer is also user-adjustable and is labeled "Floor". The slider of potentiometer 533 provides a user-adjustable means of applying a steady-state voltage to the input of mixer 531. Consequently, the voltage at the output terminal of mixer 531 will be representative of the sum of the fluctuating voltage output of voltage divider integrated circuit 525 and the user-adjusted bias voltage. The voltage at the output at mixer 531 is applied to the control inputs of both filters 502 and 503. The output of mixer 531 is also connected to the input of meter 539, which is provided with a scale calibrated to read the cutoff frequency of filter 502 as a function of the voltage at the output of mixer 531.

Thus, the momentary cutoff frequency is determined by the sum of the steady bias voltage, user-adjusted by the slider of potentiometer 533, and by the varying voltage from circuit 525, the effect of which is regulated by the user-adjustable slider of potentiometer 529; the higher the sum of the two voltages, the higher the cutoff frequency. When no signal is applied to the input of buffer amplifier 501 the cutoff frequency reading of meter 539 and the configuration of the low pass filters 502 and 503 will be a steady value dependent on the slider setting of potentiometer 533. Then, when one starts to play a record, the meter needle will immediately become active as the voltage at the slider of potentiometer 529 is added to that from the slider of potentiometer 533 in the mixer 531. When the music component of the total signal is strongest the ratio of the voltage at input 524 to that at 526 will be at its highest value. By adjustment of the slider of potentiometer 529, the user selects the fraction of the voltage that will enter 532 to add to the D.C. voltage from the slider of potentiometer 533 and, consequently, raise the cutoff frequencies of filters 502 and 503. This voltage is also applied to the meter 539 which now will be reading the instantaneous values of the varying output voltage of mixer 531, which the meter shall indicate as cutoff frequency. Meter 539 is an important aid to the user, adding the faculty of vision as a valuable supplement to the sometimes difficult-to-judge auditory perceptions of the Continuous Noise Suppressor output.

SUMMARY

The invention described herein thus effectively reduces noises in sound signals in a manner which is not audibly discernible and does not impair the quality of the sound signal. The circuit of the preferred embodiment is both practical and economical and is effective in use.

In the Switcher of the prior art, the magnitudes of the two channels were compared and if they differed by a sufficient amount indicative of transient noise components, the channel having the lesser magnitude was transmitted to the output of the Switcher. In this manner only one channel or the other was enabled through the closure of the channel's fast acting switch, or, in cases of noise below a threshold value in both channels, both switches remained open. While the prior art device was effective for the reduction of noise occurring as momentary and separated events between the two channels it failed to address the added possibility of noise occurring simultaneously in the two channels. In particular, during the instances of simultaneous noise there is the possibility of the noise components being of opposite polarity but of non-matching amplitude such that the best approximation of the music component is the average of the total signals of the two channels. The present invention is able to address such instances by enabling both channels to be conducted to the output of the switcher through simultaneous closure of the two fast acting switches, one switch located in each channel. This and other aspects of the present invention furthermore allow a more sensitive and effective threshold of operation.

The noise transient was recognized by the prior art Blanker as total signal having greater amplitude than in a preceding, pre-established interval of the total signal. A fast acting switch responded to detected noise transients, serving to interrupt transmission of the noise transients to the output of the blanker. However, the device would sometimes remove the leading edges of desired music transients, particularly music transients having low frequency components such as drum beats, voice and piano. This problem has been remedied in the present invention by utilizing two fast acting switches. The first switch is designed to interrupt only the high frequency components of the noise transient and thereby mitigate the possibility of its distorting low frequency music. The second switch is designed to interrupt only the low frequency components of the noise transient. In another aspect of the invention, the second fast acting switch is enabled only when sufficient levels of high frequency signal is detected, thereby opening upon the occurrences of deep scratches in the recording medium and, in general, during noise events typically having high frequency spectra, but prevented from opening upon the occurrences of music transients of low frequency.

In the prior art continuous noise, otherwise known as white noise or hiss, was separated from the total input signal through differentiation. The total input signal was also processed through a band pass filter such that the output represented a pre-selected frequency portion of the music content within the total input signal. The magnitures of the noise content and music content thus derived were compared to form a control signal which governed the cutoff frequency of a low pass filter. The low pass filter served to limit the amount of high frequencies in the total input signal transmitted to the output of the Continuous Noise Suppressor. While the device removed continuous noise in varying relationship with the music program, the activity of the control signal was inadequate for total input signals having appreciable continuous noise, in which case the differentiated signal representing noise overwhelmed the signal derived from the band pass filter representing music. In the present invention the control signal is a ratio of the band pass filter and the differentiated signal, resulting in the variations of the control signal even when excessive continuous noise is present. Another advantage of ratioing compared to the prior art is the ability to determine the control signal more quickly and with fewer components. The improved responsiveness of the control signal to the music component of the total signal facilitates the removal of continuous noise without the disturbance of the high frequency music components contained in the total input signal.

The invention has been described in detail with particular emphasis on the preferred embodiment, but it will be understood that variations and modifications within the spirit of the invention may occur to those skilled in the art to which the invention pertains.

What is claimed is:

1. A noise reduction system connected to at least two input channels for receiving input signals that have substantially identical program content but differing instantaneous noise transients, whereby the system selects the input signal that has the lowest instantaneous noise transient level, the system comprising:

at least two low frequency attenuators, a low frequency attenuator connected to each of the at least two input channels for equally attenuating input signals whose frequencies are below a predetermined frequency threshold for providing attenuated input signals;

a switcher coupled to the low frequency attenuators for transmitting the attenuated input signal that has the least amount of instantaneous transient noise as a transmitted signal;

and a low frequency restorer configured to mix the transmitted signal from the switcher with an inverse signal derived from the input signals for providing a mixed signal whose frequencies are not attenuated with respect to the input signals.

2. The system of claim 1, and further including a first summer for summing at least two input signals from which the low frequency restorer is configured to derive the inverse signal.

3. The system of claim 2, and further including a second summer for summing at least two attenuated input signals, wherein the switcher is configured to transmit the attenuated input signal and/or the signal from the second summer having the least amount of instantaneous transient noise to the low frequency restorer.

4. The system of claim 1, and further including a summer for summing at least two attenuated input signals, wherein the switcher is configured to transmit the attenuated input signal and/or the signal from the summer having the least amount of instantaneous transient noise to the low frequency restorer.

5. The system of claim 1, and further including an inverter configured to invert the phase of an input signal with respect to another input signal.

6. The system of claim 1, and further including a balancer configured to vary the gain of one or more input signal by a predetermined amount such that the program content of the input signals are of substantially equal magnitude.

7. The system of claim 1, wherein there are two input signals, the switcher being configured to transmit both attenuated input signals when the instantaneous levels of the input signals are of the same polarity, and to transmit the attenuated input signal having the least amount of instantaneous transient noise when the instantaneous levels of the input signals are of opposite polarity.

8. The system of claim 1, and further comprising a blanker configured to remove instantaneous transient noise that is present in the mixed signal, the blanker comprising:
   a filter for subdividing the frequencies included in the mixed signal into at least two ranges of frequency signals to provide at least two filter signals;
   a noise detector coupled to each of the at least two filter signals and configured to detect instantaneous transient noise as an instantaneous level of signal that is greater than the average signal level by a predetermined proportion to the average level in the respective filter signal;
   a switch coupled to each detector to provide the respective filter signal to a blanker output terminal when transient noise is not being detected by the respective detector, and to deny filter signal to the output terminal whose amplitude is greater than the average signal level by a predetermined proportional amount, when transient noise is being detected by the respective detector.

9. The system of claim 8, wherein the filter subdivides the mixed signal into a low frequency filter signal that is coupled to a low frequency noise detector and a low frequency switch, and a comparatively high frequency filter signal that is coupled to a high frequency noise detector and a high frequency switch.

10. The system of claim 9, wherein the low frequency switch is coupled to the high frequency noise detector such that the low frequency switch is prevented from decoupling low frequency filter signal to the output terminal except when the high frequency detector has concurrently detected a noise transient in the high frequency signal.

11. The system of claim 10, wherein the duration of the prevention is a predetermined period of time.

12. The system of claim 10 wherein the low frequency noise detector is coupled to the high frequency noise detector such that the high frequency detector is decoupled from the high frequency filter signal when a noise transient is detected by the low frequency detector.

13. The system of claim 12, wherein the high frequency detector is decoupled from the high frequency filter signal for a predetermined period of time when instantaneous transient noise is detected by the low frequency detector.

14. A system for reducing noise in an input signal, including a blanker configured to remove instantaneous transient noise that is present in the input signal, a continuous noise suppressor coupled to the output terminal of the blanker and configured to remove noise from the program component of the blanker output signal,
   the blanker comprising:
      a filter for subdividing the frequencies included in the input signal into at least two ranges of frequency signals to provide at least two filter signals;
      a noise detector coupled to each of the at least two filter signals and configured to detect instantaneous transient noise as an instantaneous level of signal that is greater than the average signal level by a predetermined proportion to the average level in the respective filter signal;
      a switch coupled to each detector to provide the respective filter signal to a blanker output terminal when transient noise is not detected by the respective detector, and to deny filter signal to the output terminal whose amplitude is greater than the average signal level by a predetermined proportional amount, when transient noise is detected by the respective detector.
   the continuous noise suppressor comprising:
      a differentiating stage coupled to the blanker output configured to detect a noise component in the blanker output signal and to produce a differentiated output signal;
      a signal detector coupled to the blanker output configured to detect the program component of the blanker output signal and to produce a program component signal;
      a divider stage configured to divide either the differentiated output signal or the program component signal by the other to generate a ratio signal;
      a variable filter having a variable cut-off frequency responsive to the ratio signal to filter frequencies from the blanker output signal in accordance with the selected cut-off frequency.

15. The system of claim 14, wherein the filter subdivides the mixed signal into a low frequency filter signal that is coupled to a low frequency noise detector and a low frequency switch, and a comparatively high frequency filter signal that is coupled to a high frequency noise detector and a high frequency switch.

16. The system of claim 15, wherein the low frequency switch is coupled to the high frequency noise detector such that the low frequency switch is prevented from decoupling low frequency filter signal to the output terminal except when the high frequency detector has concurrently detected a noise transient in the high frequency signal.

17. The system of claim 16, wherein the duration of the prevention is a predetermined period of time.

18. The system of claim 16 wherein the low frequency noise detector is coupled to the high frequency noise detector such that the high frequency detector is decoupled from the high frequency filter signal when a noise transient is detected by the low frequency detector.

19. The system of claim 18, wherein the high frequency detector is decoupled from the high frequency filter signal for a predetermined period of time when instantaneous transient noise is detected by the low frequency detector.

20. The system according to claim 14, wherein the differentiation stage includes double differentiation.

21. The system according to claim 14, wherein the signal detector includes a band-pass filter for transmitting a preselected range of frequencies in the blanker output signal.

22. The system according to claim 14 wherein the ratio signal is unresponsive to blanker output signals that are of less than a predetermined duration.

23. The system according to claim 22, wherein the predetermined duration is approximately 1 millisecond.

24. The system according to claim 14, and further including a user adjustable DC voltage source whose output voltage is combined with the ratio signal to produce an adjustable minimum cut-off frequency.

25. The system according to claim 24, and further including a user adjustable gain stage for varying the combined output voltage and ratio signal to produce an adjustable maximum cut-off frequency.

26. The system according to claim 14, and further including a user adjustable gain stage for varying the ratio signal to produce an adjustable maximum cut-off frequency.

27. The system according to claim 14, and further including a meter electrically connected to the ratio signal and configured to visually display the cut-off frequency.

28. The system according to claim 14, wherein the filter includes at least one single pole filter.

29. A continuous noise suppressor configured to remove a noise component from the program component of an input signal, the continuous noise suppressor comprising:
- a differentiating stage configured to detect a noise component in the input signal and to produce a differentiated output signal;
- a detector coupled to the input signal to detect the program component and to produce a program component signal;
- a divider stage configured to divide either the differentiated output signal or the program component signal by the other to produce a ratio signal;
- a filter having a cut-off frequency responsive to the ratio signal to filter frequencies from the input signal in accordance with the selected cut-off frequency.

30. The system according to claim 29, wherein the differentiation stage includes double differentiation.

31. The system according to claim 29, wherein the detector includes a band-pass filter for transmitting a pre-selected range of frequencies in the input signal.

32. The system according to claim 29 wherein the ratio signal is unresponsive to blanker output signals that are less than a predetermined duration.

33. The system according to claim 32, wherein the predetermined duration is approximately 1 millisecond.

34. The system according to claim 29, and further including a user adjustable DC voltage source whose output voltage is combined with the ratio signal to produce an adjustable minimum cut-off frequency.

35. The system according to claim 34, and further including a user adjustable gain stage for varying the combined output voltage and ratio signal to produce an adjustable maximum cut-off frequency.

36. The system according to claim 29, and further including a user adjustable gain stage for varying the ratio signal to produce an adjustable maximum cut-off frequency.

37. The system according to claim 29, and further including a meter electrically connected to the ratio signal and configured to visually display the cut-off frequency.

38. The system according to claim 29, wherein the filter includes at least one single pole filter.

39. The system according to claim 29, and further including a switcher configured to provide the input signal, wherein the input signal is selected by the switcher from at least two input channels.

* * * * *